US006441382B1

(12) United States Patent
Huang

(10) Patent No.: US 6,441,382 B1
(45) Date of Patent: Aug. 27, 2002

(54) DECELERATION ELECTRODE CONFIGURATION FOR ULTRA-LOW ENERGY ION IMPLANTER

(75) Inventor: Yongzhang Huang, Toyo (JP)

(73) Assignee: Axcelis Technologies, Inc.

( * ) Notice: Subject to any disclaimer, the term of this patent is extended or adjusted under 35 U.S.C. 154(b) by 0 days.

(21) Appl. No.: 09/316,657

(22) Filed: May 21, 1999

(51) Int. Cl.$^7$ .............................................. H01J 37/317
(52) U.S. Cl. .................................................. 250/492.21
(58) Field of Search ............................. 250/492.21, 294

(56) References Cited

U.S. PATENT DOCUMENTS

| | | | |
|---|---|---|---|
| 3,376,469 A | | 4/1968 | Consoli et al. ............. 315/311 |
| 3,569,757 A | * | 3/1971 | Brewer et al. .......... 250/492.21 |
| 4,480,185 A | | 10/1984 | Hashimoto ................... 250/251 |
| 4,684,848 A | | 8/1987 | Kaufman et al. ......... 315/111.81 |
| 4,766,320 A | | 8/1988 | Naitoh et al. ............. 250/492.2 |
| 5,091,655 A | | 2/1992 | Dykstra et al. ........... 250/492.2 |
| 5,160,846 A | | 11/1992 | Ray ........................ 250/492.2 |
| 5,177,366 A | | 1/1993 | King et al. ............... 240/492.2 |
| 5,196,706 A | | 3/1993 | Keller et al. ............ 250/396 R |
| 5,373,164 A | | 12/1994 | Benveniste ............ 250/492.21 |
| 5,668,368 A | * | 9/1997 | Sakai et al. ............ 250/492.21 |
| 5,693,939 A | | 12/1997 | Purser ........................ 250/251 |
| 5,747,936 A | | 5/1998 | Harrison et al. ......... 315/111.81 |
| 5,780,863 A | | 7/1998 | Benveniste et al. .... 250/492.21 |
| 5,821,534 A | * | 10/1998 | Park ............................ 250/294 |
| 5,883,391 A | | 3/1999 | Adibi et al. ............ 250/492.21 |
| 5,925,886 A | | 7/1999 | Seki et al. .............. 250/492.21 |
| 5,932,882 A | | 8/1999 | England et al. ........ 250/492.21 |
| 5,969,366 A | | 10/1999 | England et al. ........ 250/492.21 |
| 6,111,260 A | * | 8/2000 | Dawson et al. ........ 250/492.21 |

OTHER PUBLICATIONS

"Advanced Ion Beam Equipment Used For Semiconductor Production", by Peter H. Rose, *Nuclear Instruments and Methods in Physics Research* (1989), pp. 22–27.

Review of Scientific Instruments by A. J. H. Donné, vol. 66, Issue 6, Jun. 1995.

Ion Beam Epiplantation, by G. E. Thomas, L. J. Beckers, J. J. Vrakking and B. R. DeKoning, Journal of Crystal Growth 56 (1982), pp. 557–575 North–Holland Publishing Company.

Ion Beam Studies by J. H. Freeman, W. Temple, D. Beanland and G. A. Gard, Nuclear Instruments And Methods 135 (1976), pp. 1–11; © North–Holland Publishing Co.

* cited by examiner

*Primary Examiner*—Jack Berman
(74) *Attorney, Agent, or Firm*—John A. Kastelic

(57) ABSTRACT

A deceleration electrode for a high-energy, ultra-low ion implanter is provided. The deceleration electrodes are "tilted" (i.e., not perpendicular with respect the ion beam axis. The deceleration electrode reduces the energy of the ion beam and simultaneously separates neutral particles out of the ion beam. The length of the deceleration electrode is slightly longer than a conventional deceleration electrode. However, because the device functions to also separate neutral particles out of the ion beam, the need for a separate neutral particle separation device is eliminated. Thus, the compact design of the dual function electrode configuration permits a shortening of the distance that a high-current, ultra-low energy ion beam must travel to the target wafer. Further, because the neutral particles can be almost completely separated from the ion beam, the decel ratio may be set high enabling an ultra-low energy, high current ion beam. In the tilted decel apparatus of the present invention, a plurality of decel electrodes having openings are arranged in an inclined manner against the axis which is perpendicular to the base axis of a beam passage. An ion beam impinging with a predetermined ion beam offset distance and inclination angle passes through gaps formed between the decel electrodes and thus, an ion beam is decelerated and neutral particles are separated from the ion beam. Thus, an ion beam can be formed having a high current, low neutral contamination, and ultra-low energy.

13 Claims, 11 Drawing Sheets

DECELERATION ELECTRODE CONFIGURATION FOR ULTRA-LOW ENERGY ION IMPLANTER

This patent application claims priority under the Paris Convention of Japanese Patent Application, Hesei 10, Patent Application No. 139580, naming as inventor Yongzhang Huang, filed May 21, 1998 with the Japanese Patent Office in the name of Sumitomo Eaton Nova, on behalf of the inventor.

FIELD OF THE INVENTION

The present invention pertains to a deceleration electrode configuration for use in an ion implanter, and its method of operation. The deceleration electrode can be directly utilized for a high-current, ultra-low energy ion implanter to enable a high-current ion beam to be generated with ultra-low energy and with no energy contamination.

BACKGROUND OF THE INVENTION

Ion implanters are used to fabricate semiconductor devices. Typically, they generate positively charged ions such as boron ($B^+$) and phosphorous ($P^+$) from an ion source. The positively charged ions are extracted from the ion source and formed into an ion beam.

The ion beam undergoes a mass separation process in which utilizes differences in the mass and electric charge of the beam components to select only ions of appropriate charge-to-mass ration. These ions in the beam are then accelerated to achieve an energy sufficient to allow implantation into a wafer. The beam is transported along a beam passage to a wafer or wafers positioned in an implantation chamber. The ions in the beam are then implanted into the wafer or wafers.

In a prior art ion implantation apparatus, integrated circuits may be produced by selective implantation using masks and inactive layers. An apparatus for this implantation technology is large, complex and expensive. Moreover, traditional ion implanters, which operate in energy ranges exceeding one kilo-electron-volt (KeV), have limited capability with respect to low-energy ion implantation processes which are required for ultra-shallow junctions on such integrated circuits.

High current, ultra-low energy ion implantation processes are required in order to form ultra-shallow junctions in the integrated circuits. Therefore, it is necessary to expand the operating energy range of the implanter from energies of about 1 kilo-electron-volt (KeV) to a few hundred electron-volts (eV) for a commercial, most modern high-current ion implantation apparatus.

In order to obtain a high current at an ultra low energy, an ion beam having a relatively high energy is extracted from the ion source, then undergoes a mass analysis, and travels close to the proximity of a wafer where the ion beam is decelerated. An apparatus for the deceleration of an ion beam is called a deceleration (or decel) electrode. Then, the decelerated ion beam travels to a target such as a wafer.

It is contemplated that an effective high-current, ultra-low energy ion implanter will necessarily include a deceleration electrode. However, the deceleration electrode configuration for a high energy, ultra-low energy implanter is difficult to achieve for two reasons: energy contamination of the ion beam and beam "blow-up" caused by the "space charge force".

First energy contamination caused by high energy neutral particles in the ion beam, present a problem. Harmful neutral particles are produced in the region upstream of the deceleration electrode by the collisions among ions and background residual gas molecules. A portion of the ions become neutralized, thereby forming neutral particles. These neutral particles will pass through the deceleration electrode without being decelerated and will become implanted into the wafer due to their retained energy. The deceleration electrode will, however, reduce the energy of the positive ions passing therethrough prior to implantation. Because the neutral particles have energy that is greater than the decelerated ions, they will be implanted deeper into the wafer.

This phenomenon of energy contamination and is an intrinsic problem in using deceleration electrodes. When the beam energy prior to deceleration is increased in order to increase the beam current, the energy contamination problem becomes more severe. The ratio of the beam energy before the deceleration to after deceleration is referred to as the deceleration (decel) ratio.

Separating neutral particles out of the ion beam may principally eliminate the energy contamination problem. In prior art medium current ion implanters, which operate at higher energies than high-current, ultra-low energy implanters, deceleration electrodes that are oriented perpendicular to the ion beam axis accomplish deceleration of the ion beam. Neutral particles can thereby pass through the deceleration electrodes.

Neutral particle separation devices are utilized upstream of the deceleration electrodes to eliminate energy contamination. One separation mechanism is an electrical deflector wherein a transverse electric field bends the ion beam but exerts no effect on the neutral particles, which are separated after passing through the deflector. However, such a device is not acceptable for use in a high-current, ultra-low energy implanter because the neutralization of the ion beam is destroyed, exaggerating beam blow-up and preventing focused transport over a long distance. Also, the space required by the electrical deflector adds to the distance required to be traveled by the ion beam. Another separation mechanism is a magnet wherein a transverse magnetic field bends the ion beam and separates the ion beam form the neutral particles. Although the magnet does not adversely affect the beam neutralization, it is still too long to be used effectively for a high current, ultra-low energy beam.

The second problem that the present invention addresses is that of the "space charge force". Positively (like charged) ions which form the ion beam repulse each other because of the so-called "space-charge force", which becomes more dominant at lower energies. The space charge force causes the ion beam to spread or "blow-up". Because of the space-charge force, the lateral spread of an ion beam is proportional to:

$$(\sqrt{m}/\sqrt{q}) \times (Iz^2/U^{3/2}) \tag{Eq. 1}$$

wherein it is assumed that the ion beam is uniform and has a circular cross section. In the above equation, m is an ion mass, q is an ion charge, I is a beam current, U is beam energy, and z is the travelling distance of the ion beam. As is obvious from the above, a shorter ion beam travelling distance is better for a larger current.

The space-charge force becomes larger, and therefore extremely problematic, for lower ion beam energies. Thus, if an ion beam travels over a long distance to a wafer, it becomes more difficult for all ions to reach the wafer. Hence, it is necessary to keep the distance short between a deceleration apparatus and a wafer. Shortening the distance is very important in order to obtain a focused ion beam with a large current and ultra low energy. In order to resolve the second issue, it is necessary to make a separation device, which separates neutral particles from an ion beam, as compact as possible.

Thus, it is an object of the present invention to provide a deceleration for an ion implanter which can separate neutral particles out of an ion beam and, simultaneously, decelerate the positive ions in the beam prior to implantation. It is a further object to provide such a deceleration electrode that enables the formation of an energy contamination-free ultra-low energy ion beam with higher currents than that which have been previously achievable. It is a further object to provide such a deceleration electrode in compact form so as to minimize the effect of space charge force on the beam.

SUMMARY OF THE INVENTION

A deceleration electrode for a high-energy, ultra-low ion implanter is provided. The deceleration electrodes are "tilted" (i.e., not perpendicular with respect the ion beam axis. The deceleration electrode reduces the energy of the ion beam and simultaneously separates neutral particles out of the ion beam. The length of the deceleration electrode is slightly longer than a conventional deceleration electrode. However, because the device functions to also separate neutral particles out of the ion beam, the need for a separate neutral particle separation device is eliminated. Thus, the compact design of the dual function electrode configuration permits a shortening of the distance that a high-current, ultra-low energy ion beam must travel to the target wafer. Further, because the neutral particles can be almost completely separated from the ion beam, the decel ratio may be set high enabling an ultra-low energy, high current ion beam.

In the tilted decel apparatus of the present invention, a plurality of decel electrodes having openings are arranged in an inclined manner against the axis which is perpendicular to the base axis of a beam passage. An-ion -beam impinging with a predetermined ion beam offset distance and inclination angle passes through gaps formed between the decel electrodes and thus, an ion beam is decelerated and neutral particles are separated from the ion beam. Thus, an ion beam can be formed having a high current, low neutral contamination, and ultra-low energy.

DETAILED DESCRIPTION OF A PREFERRED EMBODIMENT

Figure 1:
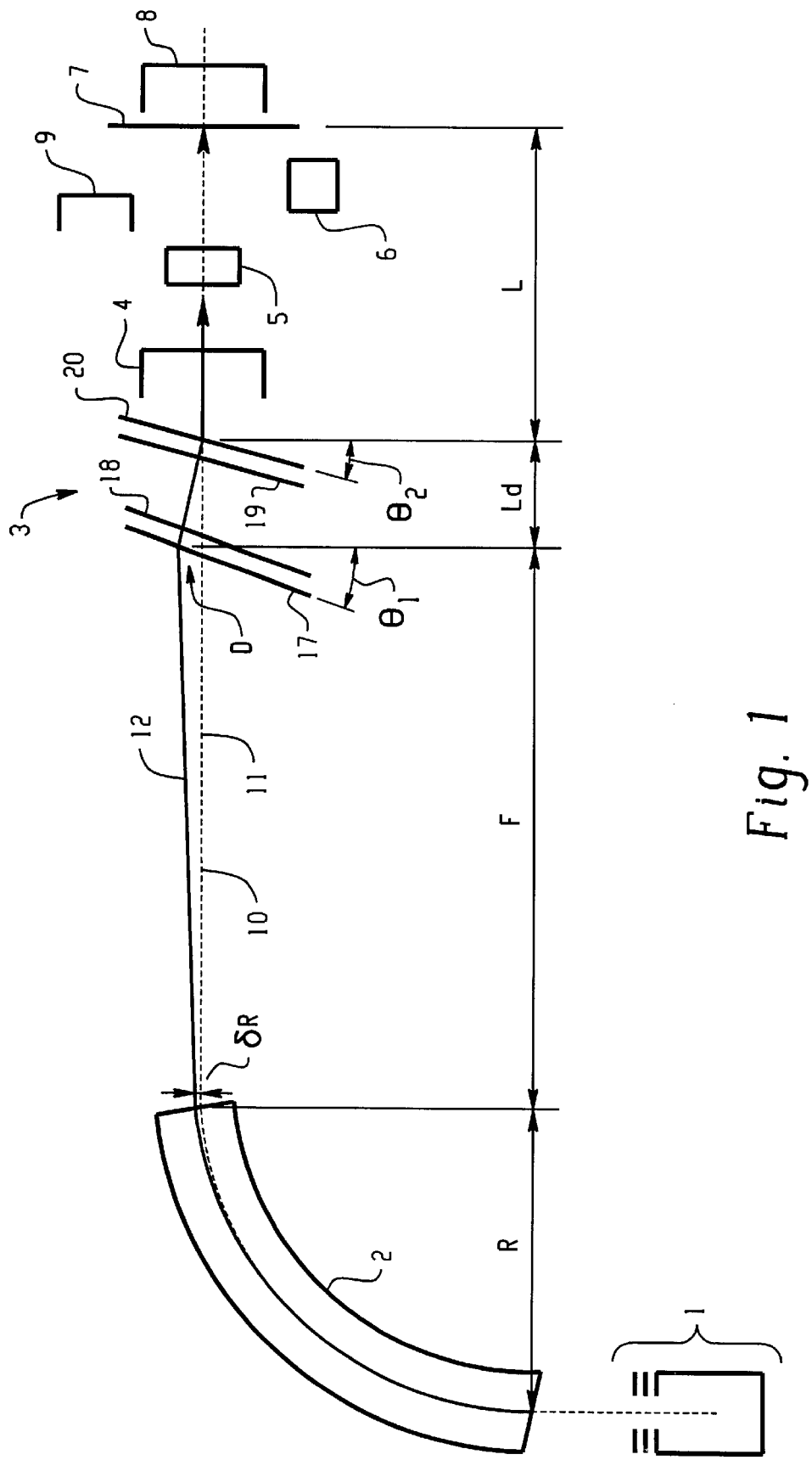
FIG. 1 shows an ultra-low energy high-current ion implanter equipped with a deceleration electrode constructed according to the principles of the present invention.

Referring now to the drawings, FIG. 1 discloses the first embodiment of the present invention. It is a simplified diagram of a high-current ion implantation apparatus having a tilted deceleration (or decel) electrode configuration 3. Tilted decel configuration 3 is represented by a plurality (in this case four) of decel electrodes 17, 18, 19 and 20. The ion implantation apparatus is mainly used in order to implant ions by colliding an ion beam with a semiconductor silicon wafer, which is used for integrated circuits.

An ion beam 11 positioned on the mechanical axis of the implanter is extracted from an ion source 1 and is further bent 90 degrees by a mass analyzer magnet 2. The output of the magnet 2 is an ion beam that travels generally along axis 10. At the horizontal focus of magnet 2, the mass analyzer magnet spreads ion beam 11 based on the difference in bending due to the difference in mass. Thus, necessary ions are separated when they pass through a resolving aperture in the mass analyzer.

Decel electrodes 17 through 20 are positioned at the analyzer horizontal focal point because the beam on the horizontal projection plane is small. Each of the openings in the decel electrodes also functions as a mass separation aperture. In the preferred embodiment, front electrode 17 of tilted decel configuration 3 of the present invention can be placed at the focal point.

In FIG. 1, these decel electrodes are arranged in two pairs (17, 18 and 19, 20) and each pair is inclined (tilted) at angles $\theta_1$ and $\theta_2$, respectively, with respect to an axis perpendicular to the beam axis 10. Each opening in the decel electrodes is positioned nearly at the center of each electrode. The opening widths are nearly equal to the offset distance $D_c$. In the embodiment shown, the dimension is approximately 2 cm. In general, the cross section of a beam is ellipsoid, with its major axis corresponding to the vertical (longer) direction of the openings. Therefore, the openings of electrodes normally have a rectangular shape, with its vertical dimension being larger than the major axis of the cross section of an ion beam, so as not to clip the ion beam in this direction.

The ion beam is or is not decelerated depending on whether decel electrodes 17 through 20 are turned on (energized) or off (de-energized). After passing through decel electrodes 17 through 20, the ion beam ultimately reaches a wafer 7. Behind wafer 7, a disk Faraday cup 8 detects the sample current of the ion beam. Many other necessary devices are placed between tilted decel configuration 3 and wafer 7.

A flag Faraday cup 4 shown in FIG. 1 measures the ion beam current when the beam is being adjusted. An electron reflector 5 stabilizes the effect of a plasma shower 6, which supplies electrons in order to reduce the charging of the wafer. A movable Faraday cup 9 is placed in proximity to the wafer as close as is physically possible, to be used only in decel mode. Faraday cup 9 simplifies the adjustment of the decelerated ultra low energy beam, and further, enables a large current to reach wafer 7.

The new tilted decel configuration 3 of the present invention similarly comprises a plurality of electrodes in other embodiments. It has in each of its embodiments at least two electrodes, and sometimes three or four. All electrodes are (tilted) inclined against an axis perpendicular to the base axis 10 of a beam passage in order to realize both separation and deceleration (or acceleration) modes of operation. When a modern commercial high-current ion implantation apparatus is being operated in the drift mode (a mode without deceleration), which is the main operation mode, the decel electrodes of the present invention remain positioned in the free field space, with appropriate apertures.

The center of ion beam 11 always moves along the mechanical axis, which is base axis 10 of the beam passage. In the decel mode, the electrodes are adjusted (tilted) as illustrated in FIG. 1, so that the beam passage is not straight. Desired ions in the beam pass through all the openings in the electrodes to wafer 7 in a decel mode because the electrodes guide their path. However, neutral particles cannot pass through the rear-most decel electrode 20 and thus, the energy contamination does not occur.

The electrical potential of each of the electrodes 3 is adjusted to a design value. Mass analyzer magnet 2 operates at a slightly lower magnetic field in a decel mode than in a normal setting. This adjustment of mass analyzer magnet 2 causes an ion beam 12 to depart from mechanical axis 10 by the certain offset distance D and to have a small deflection angle $\delta\theta$ at the end of magnet 2 (see FIG. 3).

When the ion beam drifts and reaches the entrance of decel electrode 3, the offset distance D increases because of the deflection angle $\delta\theta$. It is considered that the total offset distance D needs to be larger than, or at least equal to the mass analyzer aperture, which is approximately 2 cm. The preferred tilted decel configuration 3 of the present invention corrects for the offset distance and simultaneously decelerates the ion beam when the ion beam passes through the four decel electrodes. After passing through the decel electrodes, the decelerated ion beam travels along mechanical axis 10 again, and reaches the wafer surface. The center of the ion beam in the decel mode is marked by number 12 in FIG. 1.

Figure 2:
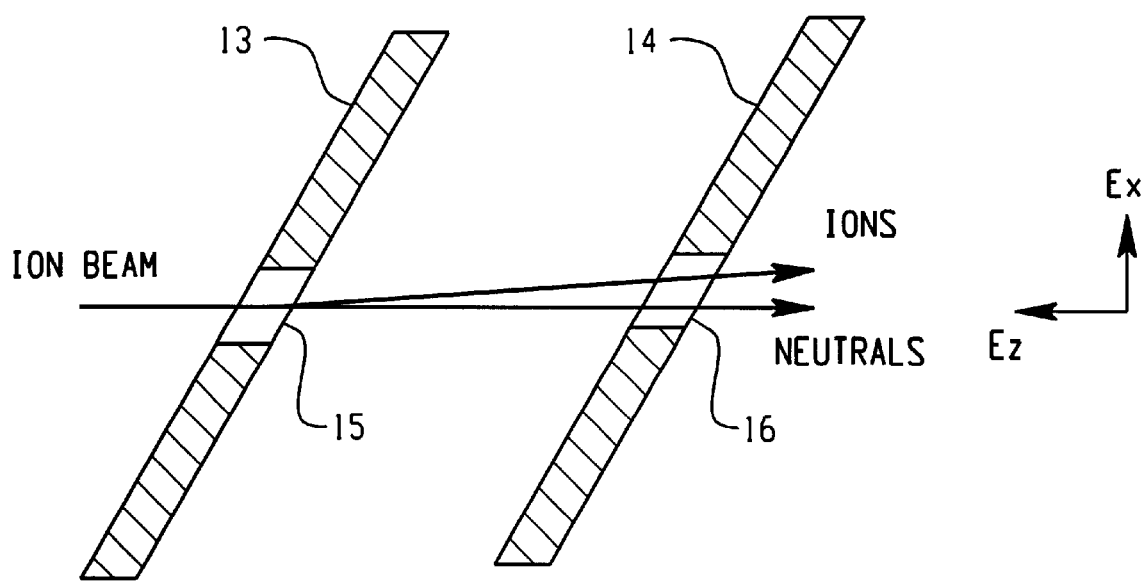
FIG. 2 shows a simplified version of the deceleration electrode of the ion implanter of FIG. 1, wherein a single pair of electrode components are oriented with an inclination (offset) to a line that is perpendicular to the ion beam axis, to effectuate both ion beam deceleration and neutral particle separation.

The present invention proposes to place decel electrodes in an inclined manner with respect to the beam axis so that they function to simultaneously separate neutral particles from an ion beam and to decelerate the ion beam. FIG. 2 illustrates the principle of a pair of inclined electrodes. In FIG. 2, the internal electric field E appears perpendicular to two electrodes 13 and 14. The first electrode 13 is located at the analyzer magnet horizontal focal point. When both electrodes are inclined with the same angle, the electric field appears to have its perpendicularly oriented components Ex and Ez. The component Ez corresponds to a prior art deceleration electric field. The component Ex bends the travelling direction of the ion beam. On the other hand, the travelling direction (the opposite direction to that of Ez) of neutral particles remain straight. As a result, the ion beam is decelerated and neutral particles are separated.

The potential difference between the two electrodes decelerates or accelerates the ions. Openings 15 and 16 provided on the electrodes affect the electric field distribution, because the internal electric field leaks through the openings. However, as long as the openings are small compared to the sizes of the electrodes, it is considered that in the present invention, the overall effects of the electric field on the ion beam do not apparently change.

However, the two electrode configuration of FIG. 2 is not used directly in ion implanters. In order to prevent electrons from being accelerated between the tilted decel electrodes, additional suppression electrodes are provided between the two pairs of electrodes in this preferred decel configuration.

Figure 3:
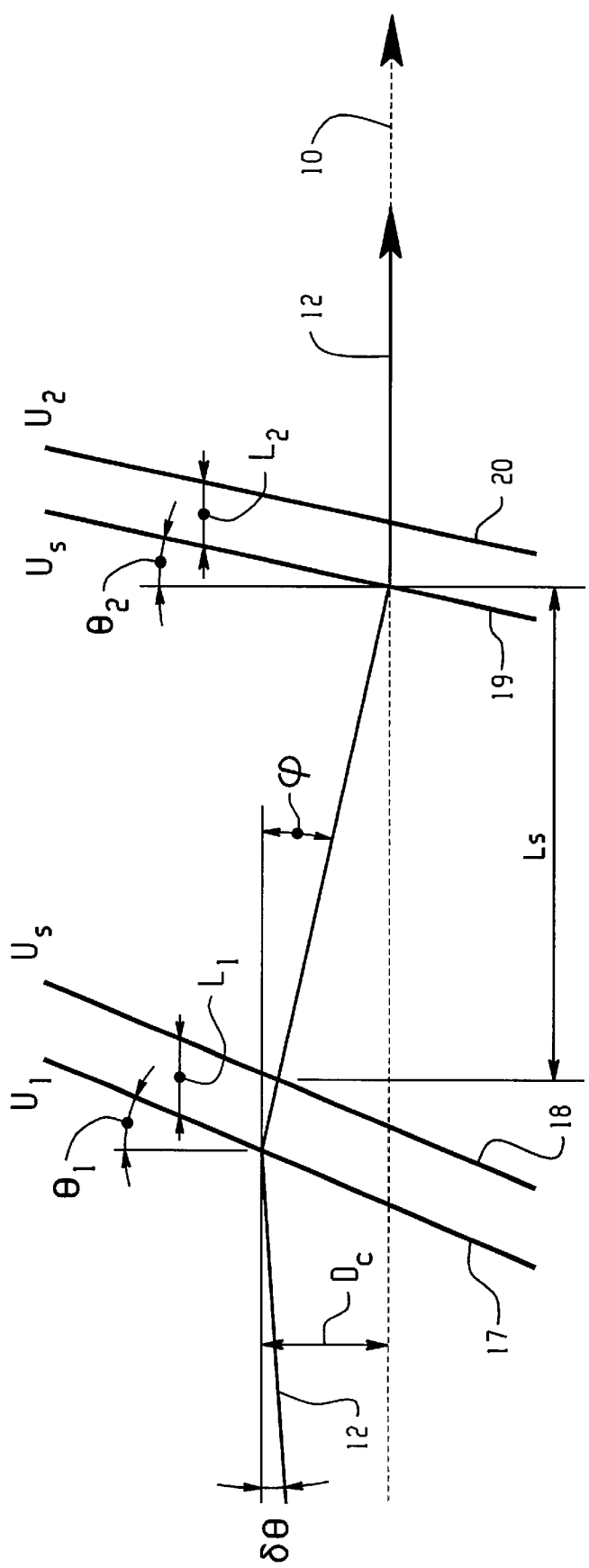
FIG. 3 shows one embodiment of the deceleration electrode, taken from FIG. 1, comprising four electrodes and three gaps.
Figure 4:
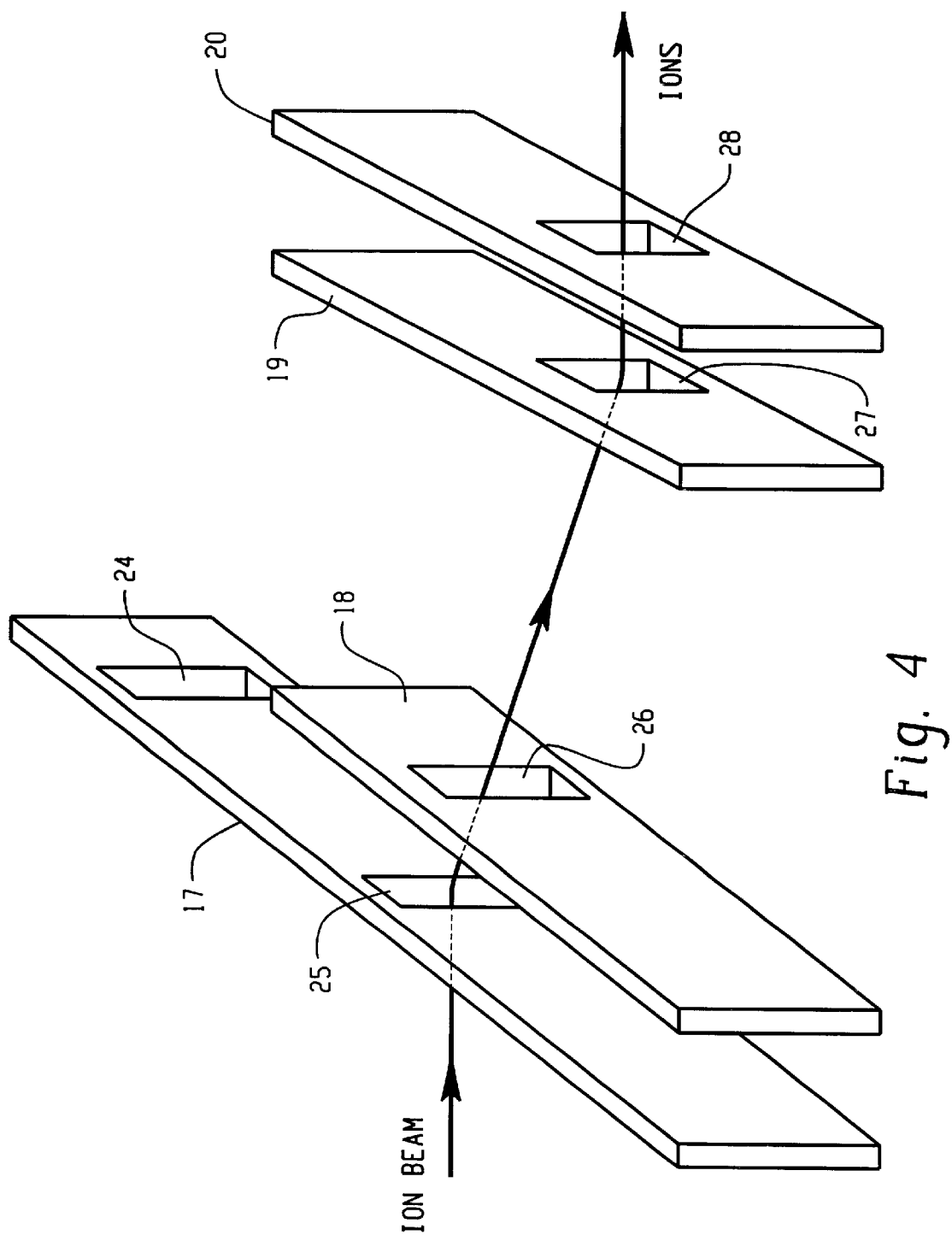
FIG. 4 is a perspective view of the deceleration electrode of FIG. 3.

These suppression electrodes make the decel configuration design more complicated. The present invention provides practical decel configurations having the suppression function as well as both of the above two functions, deceleration and separation. FIGS. 3 and 4 illustrate how a tilted decel configuration, having four electrodes and three gaps formed between each pair of the electrodes, works. FIG. 3 corresponds to tilted decel configuration 3 which is used in the ion implantation apparatus whose overall design is illustrated in FIG. 1.

Here, the four electrodes are grouped into two pairs. The first pair of electrodes 17 and 18 have an inclination of $\theta_1$ against mechanical axis 10 and form the first gap. The second pair of electrodes 19 and 20 have an inclination of $\theta_2$ against mechanical axis 10 and form the third gap. The second and third electrodes 18 and 19 are suppression electrodes. Since the suppression electrodes have the same potential, the second gap, formed between the first and second pairs of electrodes, forms a drift space without an electric field.

For the sake of a simpler explanation, the potential of each electrode is expressed in terms of the beam energy level. In FIG. 3, $U_1$ and $U_2$ are the beam energy levels before and after the ion beam passes through tilted decel configuration 3, respectively. Specifically, $U_1$ is the energy level before the beam passes through decel electrode 17, and $U_2$ is the energy level after the beam passes through decel electrode 20. $U_s$ is the energy level between decel electrodes 18 and 19 which function as suppression electrodes. For these electrodes, the relationship $U_s > U_1 > U_2$ holds true. For convenience, the ratio $U_1/U_2$ is defined as a decel ratio, and $U_s > U_1$ is defined as a suppression ratio. The decel ratio for the present invention may be set high (e.g., ratio of 3:1 for producing a 1 KeV beam from a 3 KeV beam, 6:1 for producing a 0.5 KeV beam from a 3 KeV beam, and even as high as 8:1 for producing a 0.25 KeV beam from a 2 KeV beam.

The ion beam enters into the decel electrodes with a determined deflection angle $\delta\theta$ and offset distance D at the location where the ion beam impinges into the opening of one of the decel electrodes. In FIG. 3, deflection angle $\delta\theta$ represents an angle of the impinging ion beam against base axis 10 and offset distance D represents the distance of how far away the ion beam is from base axis 10 of the beam passage. After the ion beam enters decel electrode 17, it is first accelerated and deflected in the first gap which extends up to decel electrode 18. Then, it drifts through the drift space between decel electrodes 18 and 19 and approaches base axis 10. The ion beam is decelerated in the third gap between decel electrodes 19 and 20 and deflected again at this location so that the beam travels along base axis 10. In this first embodiment, the offset distance is eventually adjusted to zero.

The above first offset distance and deflection angle of the ion beam are provided by adjusting mass analyzer magnet 2. The first order approximation value of offset distance D and the deflection angle $\delta\theta$ at the entrance of the decel are given as below.

$$\delta\theta = \delta R/R \quad \text{(Eq. 2a)}$$

$$D = \delta R(1 + F/R) \quad \text{(Eq. 2b)}$$

Here, R is the curvature radius of magnet 2, F is the distance between the magnet and decel electrode 17, D is the offset distance which is required at the decel electrode, and δR is the offset distance at the exit of the magnet (see FIGS. 1 and 3). Usually, because R is much larger than D, δθ and δR are fairly small, and thus these factors do not affect the performance of the magnet.

According to Schnell's law, the angles have the relationship as below:

$$\sqrt{U_1} \sin(\theta_1+\delta\theta)=\sqrt{U_s} \sin(\theta_1+\delta\theta-\phi) \qquad (Eq. 3)$$

$$\sqrt{U_s} \sin(\theta_2+\phi)=\sqrt{U_2} \sin\theta_2 \qquad (Eq. 4)$$

Solving these motion equations enables decel electrode positions with a focus for the beam offset distance D to be estimated. Moreover, the offset correction distance $D_c$ is shown by the following equation:

$$D_c = \frac{2L_1\sin(\theta_1+\delta\theta)}{\sqrt{U_s/U_1 - \sin^2(\theta_1+\delta\theta)} + \cos(\theta_1+\delta\theta)} + \frac{2L_2\sin(\theta_2-\varphi)}{\sqrt{U_2/U_s - \sin^2(\theta_2-\varphi)} + \cos(\theta_2-\varphi)} + L_s\tan\varphi \qquad (Eq. 5)$$

A desirable form of this equation is $D_c=D$, to achieve complete offset correction. Here, $L_1$ (the first gap) and $L_2$ (the third gap) are the lengths of the front and rear gaps, respectively. $L_s$ is the second gap which is the drift space between the two suppression electrodes. Moreover, $\phi$ is the deflection angle of the ion beam, which is bent in the second gap, against the beam base axis.

For the decel configuration, an approximation, $$L_d \approx L_1+L_2+L_s, \qquad (Eq. 6)$$

holds true, where $L_d$ is the total length of decel electrode configuration. Adjusting all of the above parameters will determine the most appropriate parameter for a commercial high-current ion implantation apparatus.

When a decel configuration is mechanically simplified, $\theta_1$, $\theta_2$ and D are considered to be constants. Furthermore, considering that a decel electrode works over a wide range of a decel ratio, the design can be simplified. For example, if $\theta_1=30$ degrees, $\theta_2=15$ degrees, D=2 cm, $L_1=L_2=1$ cm and $L_s=8$ cm, then $L_d$ becomes approximately 10 cm, an acceptable length for a modern high-current ion implantation apparatus.

FIG. 4 shows the offset and the suppression ratio vary as functions of the decel ratio. It is clearly seen that the offset changes only a little if the decel ratio is larger than three. This conclusion strongly means that the tilt decel could work over a wide range of decel ratios.

The following Table 1 lists the operation parameters for several energy levels.

| $U_2$ | $U_1$ | $U_1/U_2$ | $U_s/U_1$ | $\theta_1$ | $\theta_2$ | $\delta\theta$ | $D_c$ |
|---|---|---|---|---|---|---|---|
| 1 KeV | 3 KeV | 3 | 1.8 | 30° | 15° | 1.5° | 1.9 cm |
| 0.5 KeV | 3 KeV | 6 | 2.2 | 30° | 15° | 1.5° | 2.1 cm |
| 0.25 KeV | 2 KeV | 8 | 2.4 | 30° | 15° | 1.5° | 2.2 cm |

Each inclination angle of the electrodes is fixed and each offset correction distance $D_c$ is similar to each other. The performances of an ion implantation apparatus will not be affected by a small offset such as 1 or 2 mm away from the mechanical axis. Assuming that the rear electrode is at the ground potential (0 volts), the potential of the other electrodes can be determined as $-(U_s-U_2)$ for the suppression electrodes, and $-(U_1-U_2)$ for the front electrode.

Figure 5:
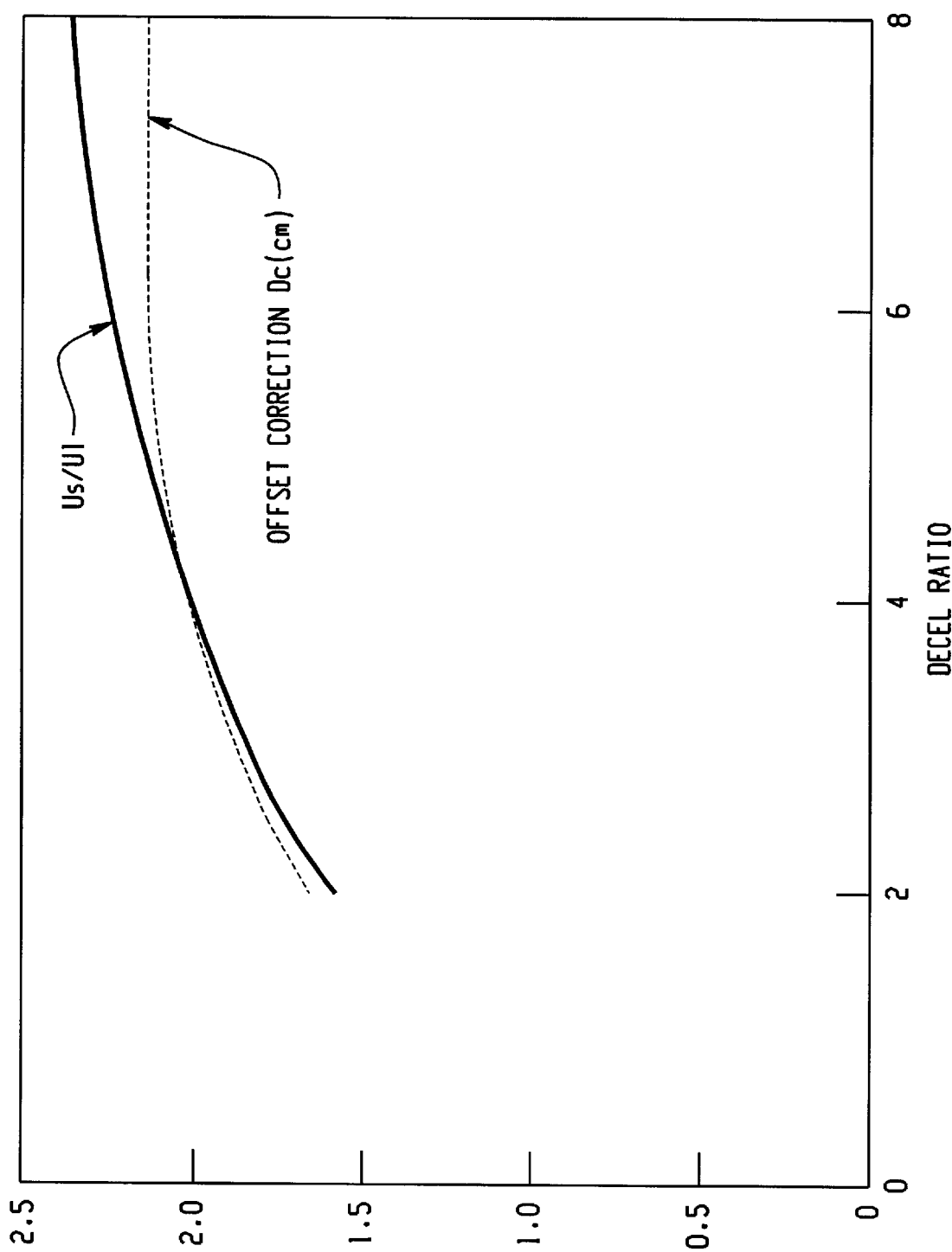
FIG. 5 is a graph of the relationship of decel ratio of the deceleration electrode versus offset correction distance $D_c$ of the deceleration electrode of FIG. 3.

FIG. 5 graphs the details of a tilted decel configuration when the inclination angles of its electrodes are fixed. It shows the suppression ratio and offset correction distance as a function of a varying decel ratio. The graph makes it obvious that the offset correction distance varies only slightly when the decel ratio is larger than 3. The results means that tilted decel configuration 3 can operate over a wide range of the decel ratio without having to alter the mechanical structure. Therefore, tilted decel configuration 3 can be easily manufactured from a mechanical standpoint.

It is known that space charge greatly affects the behavior of an ion beam having an ultra low energy. The lateral spread of an ion beam is given as a function of $U^{-3/2}$ based on the space-charge force. Therefore, the beam travelling distance beyond the third gap of a tilted decel configuration becomes a very important design consideration.

The two gaps, the first and the third, of tilted decel configuration 3 also provides a lateral convergence (transverse focusing) forces to an ion beam based on a potential difference of the electrodes. As is the case with other ordinary electrodes, a potential difference in each gap determines the magnitude of the beam convergence force. The suppression ratio $U_s/U_1$ provides a means to alter the convergence force regarding a tilted decel configuration. A suppression ratio which satisfies both the offset correction and the lateral convergence of an inclined decel configuration can be selected through design simulation and research.

It is suggested that movable Faraday cup 9, which is placed behind tilted decel configuration 3 in FIG. 1, is positioned as close as physically possible to wafer 7. The distance between Faraday cup 9 and tilted decel configuration 3 is long. The distance between Faraday cup 9 and wafer 7 is short. Faraday cup 9 works only with a decelerated ultra low energy beam. When the decelerated beam is being adjusted, the Faraday cup is placed on mechanical axis 10.

There are two advantages for Faraday cup 9. The first advantage is that during an operation, an operator can make an adjustment by maximizing the ion beam current as measured by Faraday cup 9. Then, the offset will be corrected for the correct amount and the ion beam will travel along mechanical axis 10. The second advantage is that the travelling passage becomes shorter and most of the ion beam can reach a wafer. It is difficult for a low energy beam to travel and hence, a longer travelling distance will increase the beam loss. After the adjustment, Faraday cup 9 is removed from mechanical axis 10.

Figure 6:
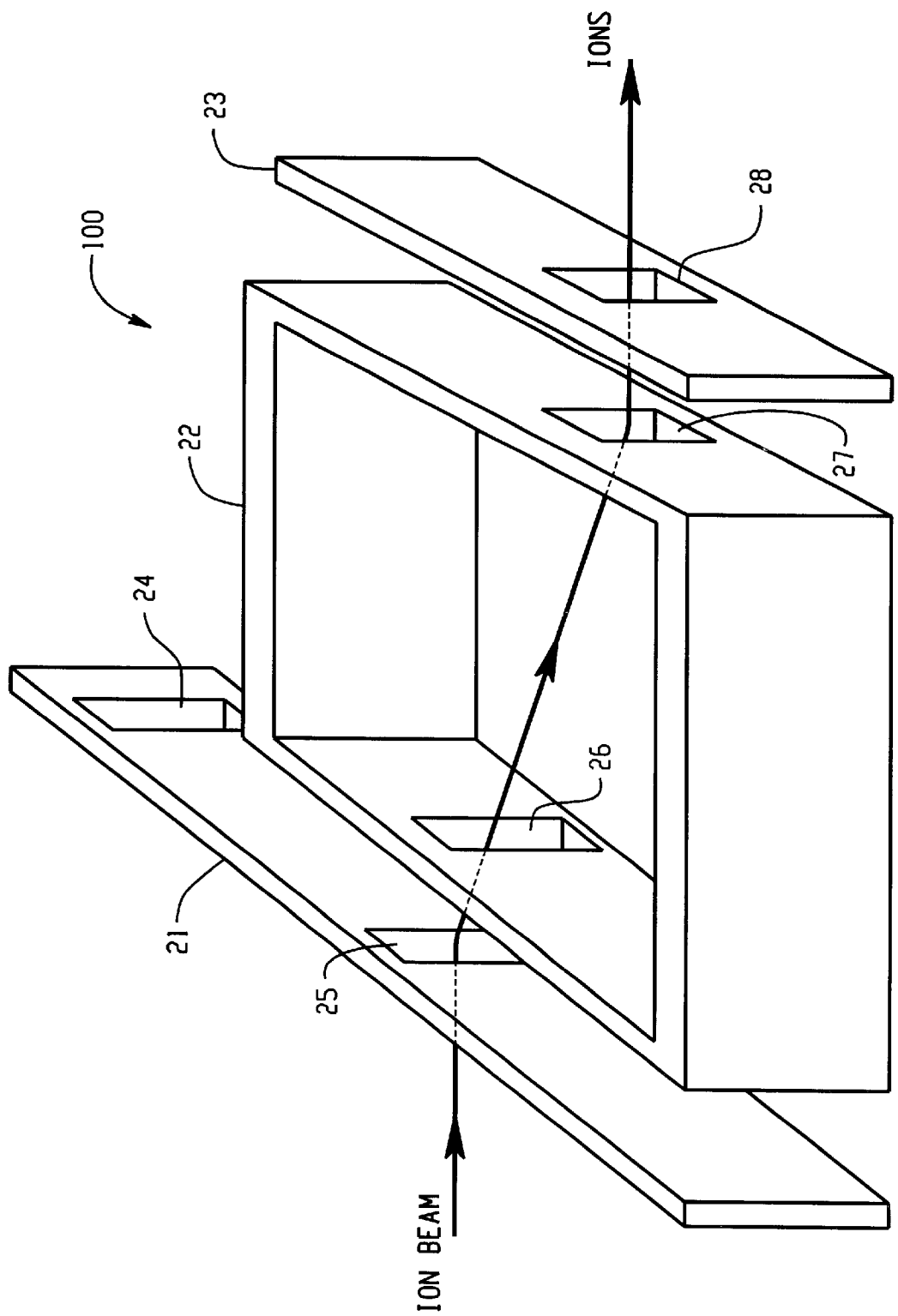
FIG. 6 is a perspective view of a second embodiment of the deceleration electrode comprising three electrodes.

Next, FIG. 6 shows the second embodiment of a tilted decel configuration 100 in which the present invention is applied. In order to make the mechanical structure simple, two suppression electrodes are connected to form one suppression box 22. Many slots are formed in the surface of this box so that the vacuum level may be easily maintained. Inside the suppression box 22 is a zero electric field.

Figure 7:
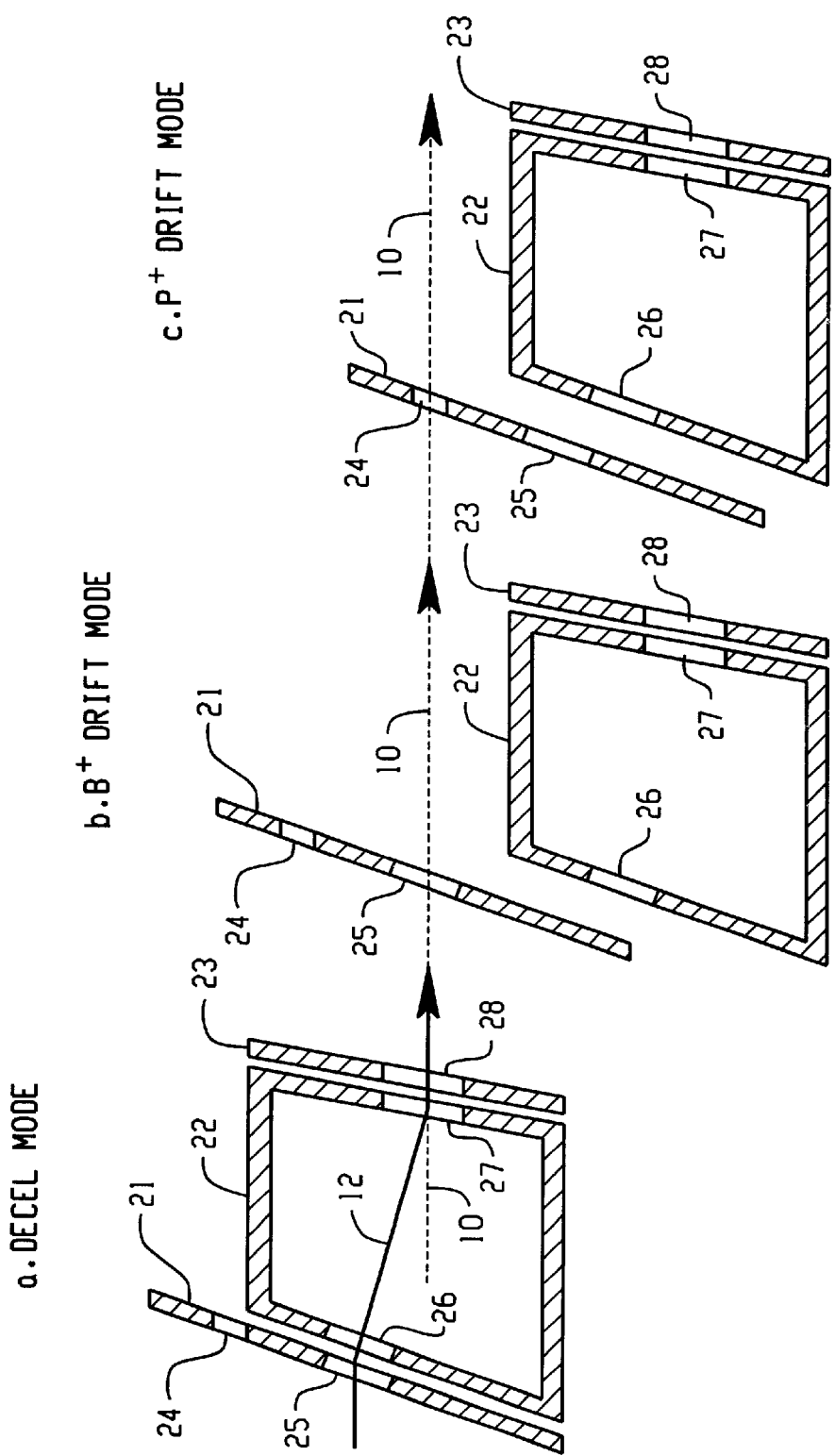
FIG. 7 shows the three operational modes of the deceleration electrode of FIG. 6, comprising (a) a decel mode, (b) a drift mode for a boron ion beam, and (c) a drift mode for a phosphorous ion beam.

The tilted decel configuration 100 not only operates with an ultra-low energy beam under a decel mode, but also operates well with a relatively high energy beam under a drift mode. A preferred mechanical structure of the tilted decel configuration 100 is illustrated in FIGS. 7(a) through 7(c), showing three operation modes: (a) decel mode; (b) $B^+$ drift mode; and (c) $P^+$ drift mode.

Tilted decel configuration 100 includes three major sections; a front electrode 21, suppression box 22 and a rear electrode 23. Their lengths are determined to be optimum for a desired commercial high-current ion implantation apparatus. The electrode positions under a decel mode are illustrated in FIG. 7(a).

Front electrode 21 is positioned at a focus of mass analyzer magnet 2. Front electrode 21 has two openings, one of which is an opening 25 for boron and the other of which is an opening 24 for phosphorous. Both openings 24 and 25 have similar functions as an aperture in a high-current ion implantation apparatus. One of the openings for a selected ion species is positioned the designed offset distance away from mechanical axis 10. The other electrodes, suppression box 22 and rear electrode 23, are placed at their designed positions. An opening 28 on rear electrode 23 is positioned exactly on mechanical axis 10. Moreover, these three sections have connections so that they have designed potentials.

Neutral particles which are generated in front of front electrode 21 can not pass through opening 28 of rear electrode 23 because rear opening 28 is displaced with respect to (not aligned with) the pass through front opening 25. Neutral particles which are generated in suppression box 22 can travel through the last opening 28. However, they will collide with the walls of the ion beam passage before reaching wafer 7 and are eliminated. Therefore, when tilted decel configuration 100 is used in an ion implantation apparatus, energy contamination will not occur.

The high-energy section of a tilted decel apparatus of the present invention is much longer than that of a prior art decel apparatus. The ion beam will encounter a real deceleration beyond the third gap. This means that the beam travelling distance between a decelerated beam to the wafer is effectively shorter by the length of the tilted decel electrode than that in an ion implantation apparatus using a prior art decel configuration. The ion beam energy loss during the travel to the wafer becomes smaller because the beam travelling distance is shorter. The number of ions reaching the wafer will increase for this gain and the beam current with tilted decel electrode 100 becomes larger than that in a prior art decel configuration.

When the decel electrode configuration is being operated under a drift mode for boron (FIG. 7(b)), it is in a turned off state in which the potential is zero. Opening 25 for boron of the front electrode is positioned on mechanical axis 10. Moreover, suppression box 22 and rear electrode 23 are lowered below mechanical axis 10. Thus, a boron ion beam passes through opening 25 of the front electrode and travels straight to a wafer without being affected by the other electrodes. When a phosphorous beam is used (FIG. 7(c)), front electrode 21 is readjusted so that opening 24 for phosphorous coincides with mechanical axis 10, as illustrated in FIG. 7(c). Thus, tilted decel configuration 10 of the present invention does not adversely affect drift mode operations because in drift modes, it can be adjusted so that an opening for a desired ion species on the front electrode is placed on the base axis of its beam passage.

Figure 8:
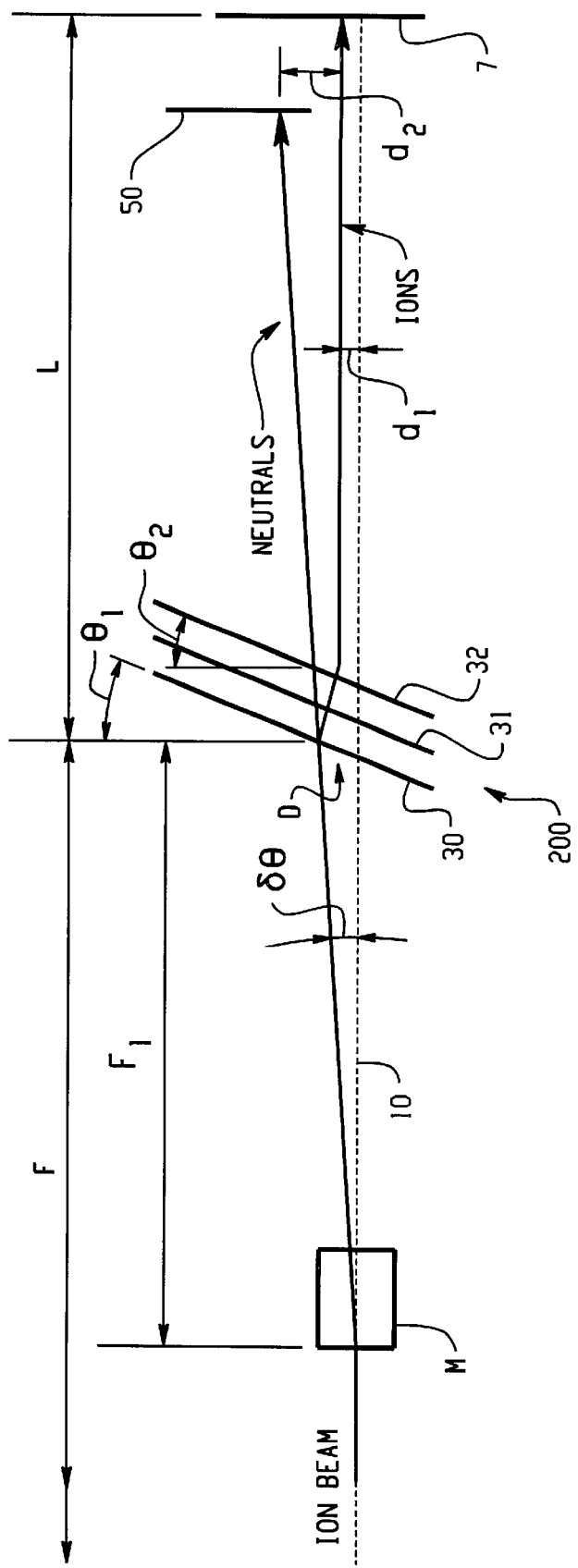
FIG. 8 shows a third embodiment of the deceleration electrode, comprising three electrodes.
Figure 9:
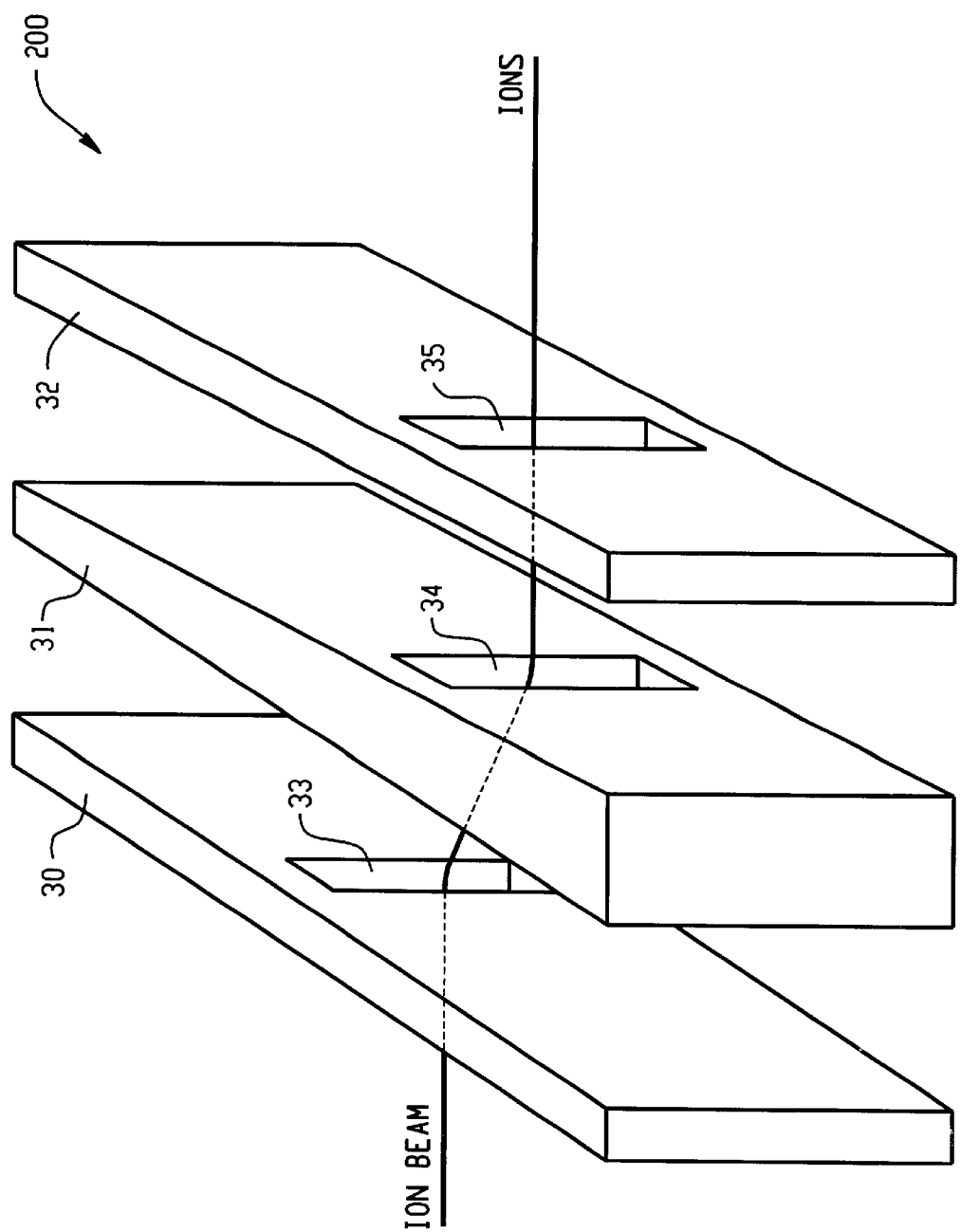
FIG. 9 is a perspective view of the deceleration electrode of FIG. 8.

Next, FIGS. 8 and 9 illustrate the third embodiment of the present invention, a tilted decel configuration 200. FIG. 8 shows the principle of ion beam travelling through the decel electrodes with a deflection angle δθ. FIG. 9 illustrates the structural arrangement of decel electrodes 30 through 32 and the travelling pass of an ion beam. In this embodiment, tilted decel configuration 200 comprises three tilted decel electrodes, a front electrode 30, a suppression electrode 31 and a rear electrode 32. The electrical potentials of the electrodes 30, 31 and 32 are $-(U_1-U_2)$, $-(U_s-U_2)$, and zero, respectively. The electrodes have openings 33, 34, and 35, respectively, through which an ion beam passes. Front electrode 30 has an inclination angle $\theta_1$ against an axis perpendicular to the mechanical axis (base axis), and rear electrode 32 has an inclination angle $\theta_2$.

In FIG. 8, after an ion beam passes through a mass analyzer magnet, the ion beam travels in the direction which is deflected from a mechanical axis 10 with a deflection angle δθ by the deflection magnet. The first electrode 30 is located at the horizontal focal point of the analyzer magnet. The ion beam passes through the three decel electrodes 30 through 32 and ions and neutral particles are separated (pass straight through). The ions are accelerated and bent at the first electrode 30, then decelerated and bent once again at the second electrode 32. When the ions exit through the opening on rear electrode 32, the offset distance D is not completely corrected and travel in parallel to the mechanical axis but with a certain distance d1 away from mechanical axis 10. Thus, the third embodiment is different from the above-mentioned first and second embodiments in which the offset distance D is adjusted to zero.

Even in the case as this in which the offset distance D is corrected to be d1, ions and neutral particles are separated. In other words, ions collide with a wafer with a certain distance away from mechanical axis 10, while neutral particles travel straight without being affected by the decel electrodes and a scraper 50, which is placed near the wafer, intercepts their pass. In this embodiment, scraper 50, which captures neutral particles, is positioned so that it is perpendicular to mechanical axis 10. However, it can be placed in any manner as long as it captures neutral particles before they reach the wafer. In FIG. 8, neutral particles colliding with scraper 50 and ions passing the extrapolated line from the scraper before colliding with the wafer are separated by a distance $d_2$, and thus, the ions and neutral particles are completely separated when the ions collide with the wafer. This third embodiment of the invention may be used in applications where the distance $d_2$ need not be as large as in the second embodiment.

Figure 10:
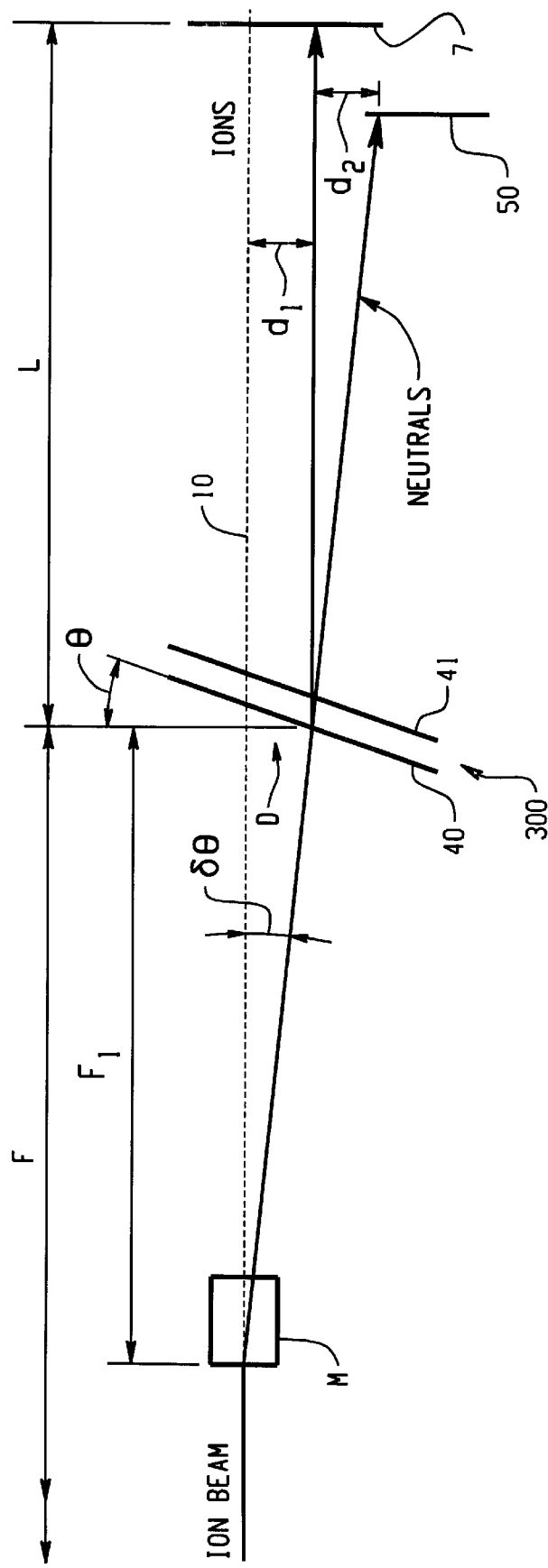
FIG. 10 shows a fourth embodiment of the deceleration electrode, comprising two electrodes.
Figure 11:
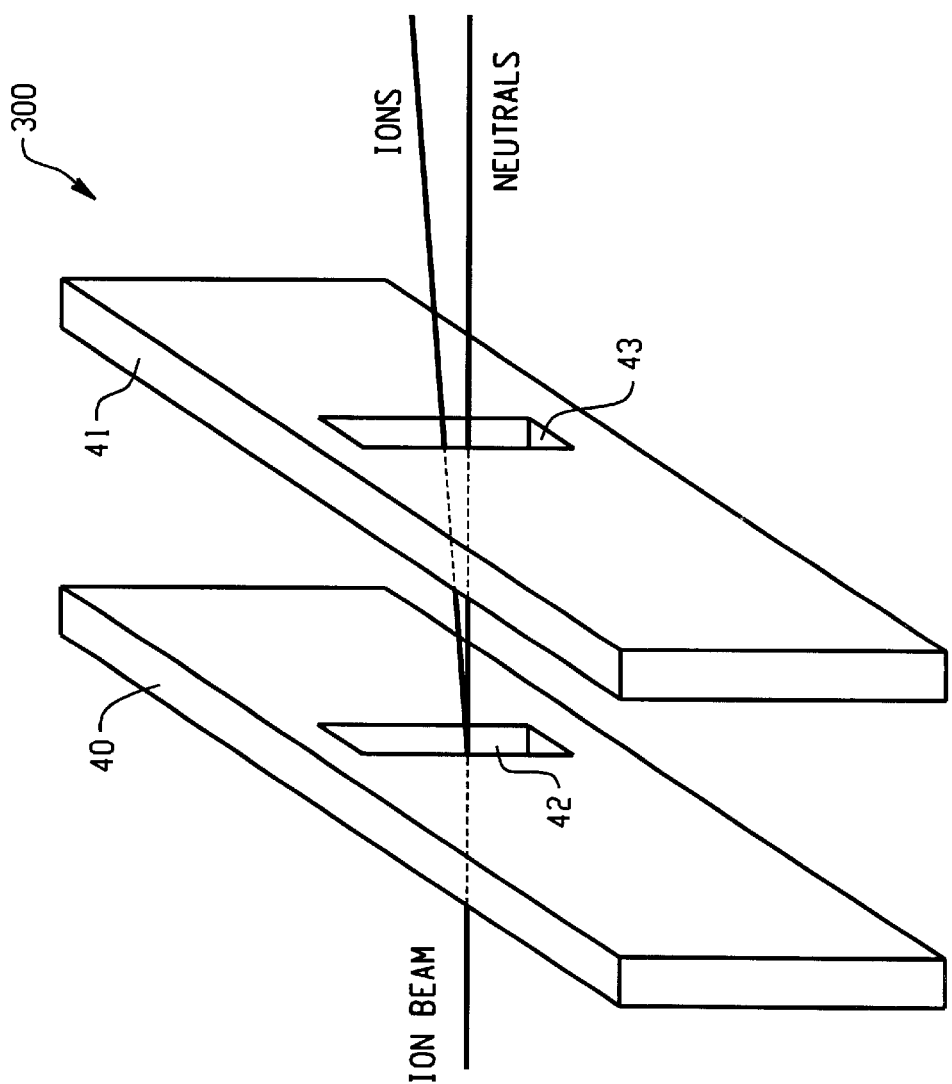
FIG. 11 is a perspective view of the deceleration electrode of Figure

In FIGS. 10 and 11, the fourth embodiment of the present invention, a tilted decel configuration 300, is illustrated. This embodiment has two decel electrodes 40 and 41, and the middle suppression electrode is discarded. Both ions and neutral particles pass through openings 42 and 43 of decel electrodes 40 and 41. Electrode 40 is located at the horizontal focal point and has a potential of $-(U_1-U_2)$, and electrode 41 has a potential of zero. These electrodes have an inclination angle of θ against an axis perpendicular to a mechanical axis 10. In this example as well, ions are decelerated and bent by decel electrodes 40 and 41, while neutral particles travel straight through them without receiving any effect. Thus, ions and neutral particles are separated and a scraper 50 captures neutral particles, while ions can reach a wafer 7. Like the third embodiment, this fourth embodiment of the invention may be used in applications where the distance $d_2$ need not be as large as in the second embodiment.

Accordingly, a preferred embodiment has been described for a decel electrode configuration for a high-current, ultra-low energy ion implanter. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

I claim:

1. An ion implanter, comprising:
   (i) an ion source from which an ion beam is extracted;
   (ii) an analyzer magnet for mass analyzing the extracted ion beam and for outputting a mass analyzed ion beam along a first axis;
   (iii) an electrode configuration comprising at least two electrodes for (a) decelerating the positively charged ions in the mass analyzed ion beam and (b) separating the mass analyzed ion beam into positively charged ions and high energy neutral particles by electrostatically deflecting the positively charged ions at least once away from said first axis along a second axis, and allowing said high energy neutral particles to continue in a direction substantially along said first axis; wherein at least one of said at least two electrodes is energized to create an electrical field with mutually orthogonal field components, one of said field components responsible for decelerating the positively charged ions in the mass analyzed ion beam and the other of said field components responsible for separating the mass analyzed ion beam into positively charged ions and high energy neutral particles; and (iv) a support for a wafer into which are implanted the positively charged ions.

2. An ion implanter, comprising:

(i) an ion source from which an ion beam is extracted;

(ii) an analyzer magnet for mass analyzing the extracted ion beam and for outputting a mass analyzed ion beam along a first axis;

(iii) an electrode configuration comprising at least two electrodes for (a) decelerating the positively charged ions in the mass analyzed ion beam and (b) separating the mass analyzed ion beam into positively charged ions and high energy neutral particles by electrostatically deflecting the positively charged ions at least once away from said first axis along a second axis, and allowing said high energy neutral particles to continue in a direction substantially along said first axis; wherein each of said at least two electrodes is positioned not substantially perpendicular to the first axis but is instead tilted with respect thereto; and (iv) a support for a wafer into which are implanted the positively charged ions.

3. An ion implanter, comprising:

(i) an ion source from which an ion beam is extracted;

(ii) an analyzer magnet for mass analyzing the extracted ion beam and for outputting a mass analyzed ion beam along a first axis;

(iii) an electrode configuration comprising at least three electrodes for (a) decelerating the positively charged ions in the mass analyzed ion beam and (b) separating the mass analyzed ion beam into positively charged ions and high energy neutral particles by electrostatically deflecting the positively charged ions at least once away from said first axis along a second axis, and allowing said high energy neutral particles to continue in a direction substantially along said first axis; wherein at least one of said at least three electrodes is energized to create an electrical field with mutually orthogonal field components, one of said field components responsible for decelerating the positively charged ions in the mass analyzed ion beam and the other of said field components responsible for separating the mass analyzed ion beam into positively charged ions and high energy neutral particles; and (iv) a support for a wafer into which are implanted the positively charged ions.

4. An ion implanter, comprising:

(i) an ion source from which an ion beam is extracted;

(ii) an analyzer magnet for mass analyzing the extracted ion beam and for outputting a mass analyzed ion beam along a first axis;

(iii) an electrode configuration comprising at least three electrodes for (a) decelerating the positively charged ions in the mass analyzed ion beam and (b) separating the mass analyzed ion beam into positively charged ions and high energy neutral particles by electrostatically deflecting the positively charged ions at least once away from said first axis along a second axis, and allowing said high energy neutral particles to continue in a direction substantially along said first axis; wherein each of said at least three electrodes is positioned not substantially perpendicular to the first axis but is instead tilted with respect thereto; and (iv) a support for a wafer into which are implanted the positively charged ions.

5. An ion implanter, comprising:

(i) an ion source from which an ion beam is extracted;

(ii) an analyzer magnet for mass analyzing the extracted ion beam and for outputting a mass analyzed ion beam along a first axis;

(iii) an electrode configuration comprising at least two adjacently-positioned electrodes for (a) decelerating the positively charged ions in the mass analyzed ion beam and (b) separating the mass analyzed ion beam into positively charged ions and high energy neutral particles by electrostatically deflecting the positively charged ions at least once away from said first axis along a second axis, and allowing said high energy neutral particles to continue in a direction substantially along said first axis; and (iv) a support for a wafer into which are implanted the positively charged ions, wherein the wafer support resides in a plane that is positioned substantially perpendicular to the second axis.

6. The ion implanter of claim 5, wherein a scraper device is provided for collecting the neutral particles that pass through said electrode configuration.

7. The ion implanter of claim 5, further comprising a resolving aperture positioned between said analyzer magnet and said electrode configuration, wherein said electrode configuration is de-energized or displaced from said first axis when the ion implanter is operated in a drift mode.

8. An ion implanter, comprising:

(i) an ion source from which an ion beam is extracted;

(ii) an analyzer magnet for mass analyzing the extracted ion beam and for outputting a mass analyzed ion beam along a first axis;

(iii) an electrode configuration comprising at least three adjacently-positioned electrodes for (a) decelerating the positively charged ions in the mass analyzed ion beam and (b) separating the mass analyzed ion beam into positively charged ions and high energy neutral particles by electrostatically deflecting the positively charged ions at least once away from said first axis along a second axis, and allowing said high energy neutral particles to continue in a direction substantially along said first axis;

(iv) a support for a wafer into which are implanted the positively charged ions; and (v) a resolving aperture positioned between said analyzer magnet and said electrode configuration, wherein said electrode configuration is de-energized or displaced from said first axis when the ion implanter is operated in a drift mode.

9. The ion implanter of claim 8, wherein a first gap between the first and second of said at least three electrodes is responsible for separating the mass analyzed ion beam into positively charged ions and high energy neutral particles, and a second gap between the second and third of said at least three electrodes is responsible for decelerating the positively charged ions in the mass analyzed ion beam.

10. The ion implanter of claim 8, wherein a first of said at least three electrodes deflects the mass analyzed ion beam from said first axis to said second axis, a second of said at least three electrodes is a suppression electrode which does not deflect the mass analyzed ion beam, and a third of said at least three electrodes re-deflects the deflected mass analyzed ion beam along a third axis which is substantially parallel to but offset from said first axis.

11. The ion implanter of claim 10, wherein the wafer support resides in a plane that is positioned substantially perpendicular to said first and third axes.

12. The ion implanter of claim 8, wherein said electrode configuration comprises at least four electrodes arranged in two pairs each comprising two electrodes, wherein a first pair of electrodes deflects the mass analyzed ion beam from said first axis to said second axis, and a second pair of electrodes re-deflects the deflected mass analyzed ion beam along a third axis which is substantially parallel to but offset from said first axis.

13. The ion implanter of claim 12, wherein all of said at least four electrodes in both pairs of electrodes are positioned not substantially perpendicular to the first axis but are instead tilted with respect thereto.

* * * * *